US007101627B2

(12) United States Patent
MacDonald et al.

(10) Patent No.: US 7,101,627 B2
(45) Date of Patent: Sep. 5, 2006

(54) HEAT-STABILISED POLY(ETHYLENE NAPHTHALATE) FILM FOR FLEXIBLE ELECTRONIC AND OPTO-ELECTRONICS DEVICES

(75) Inventors: William Alasdair MacDonald, Cleveland (GB); Leigh Beckett Richardson, Middlesborough (GB)

(73) Assignee: DuPont Teijin Films U.S. Limited Partnership, Wilmington, DE (US)

( * ) Notice: Subject to any disclaimer, the term of this patent is extended or adjusted under 35 U.S.C. 154(b) by 0 days.

(21) Appl. No.: 10/488,846

(22) PCT Filed: Sep. 10, 2002

(86) PCT No.: PCT/GB02/04112

§ 371 (c)(1),
(2), (4) Date: Mar. 25, 2004

(87) PCT Pub. No.: WO03/022575

PCT Pub. Date: Mar. 20, 2003

(65) Prior Publication Data

US 2004/0247916 A1     Dec. 9, 2004

(30) Foreign Application Priority Data

Sep. 11, 2001 (GB) .................. 0122015.1
Apr. 12, 2002 (GB) .................. 0208505.8

(51) Int. Cl.
B32B 27/06 (2006.01)
B32B 27/08 (2006.01)
B32B 27/36 (2006.01)
B32B 38/18 (2006.01)

(52) U.S. Cl. ............ 428/480; 428/910; 528/308; 264/280; 264/288.4; 264/289.3; 264/290.2

(58) Field of Classification Search ............ None
See application file for complete search history.

(56) References Cited

U.S. PATENT DOCUMENTS 3,683,060 A * 8/1972 Tanabe et al. ............ 264/235.8
3,875,119 A * 4/1975 Aoki et al. ................ 528/298
5,496,688 A     3/1996 Okamoto et al.
5,512,664 A * 4/1996 Lee et al. .................... 534/799
5,723,208 A     3/1998 Suzuki et al.
5,858,490 A     1/1999 Mori et al.
5,968,871 A * 10/1999 Katashima et al. ......... 503/227
6,303,210 B1 * 10/2001 Watanabe et al. ........... 428/141
6,303,228 B1 * 10/2001 Watanabe et al. ........ 428/423.7
6,537,657 B1 * 3/2003 Watanabe et al. ........... 428/331
6,890,471 B1 * 5/2005 Kobayashi et al. ...... 264/290.2
2002/0098344 A1 * 7/2002 Mizuno et al. .............. 428/334

FOREIGN PATENT DOCUMENTS

| DE | 4310082 | 9/1994 |
|---|---|---|
| DE | 19729449 | 11/1998 |
| EP | 0 225 630 A2 | 6/1987 |
| EP | 0 225 631 A2 | 6/1987 |
| EP | 0 226 162 A1 | 6/1987 |
| EP | 0 229 346 A1 | 7/1987 |
| JP | A 59/088719 | 5/1984 |
| JP | A 59/088719 A | 5/1984 |
| JP | A 61/051323 | 3/1986 |
| JP | A 63/042845 A | 8/1986 |
| WO | WO 98/11150 | 3/1998 |
| WO | WO 03/087247 A1 * | 10/2003 |

OTHER PUBLICATIONS

G. Teyssedre, D. Mary, J. L. Auge and C. Laurent, Dependence of electroluminescence intensity and spectral distribution on ageing time in polyethylene naphthalate as modelled by space charge modified internal field, J. Phys. D. Appl. Phys. 32, 1999, pp. 2296-2305.

* cited by examiner

*Primary Examiner*—Vivian Chen
(74) *Attorney, Agent, or Firm*—RatnerPrestia

(57) ABSTRACT

The use of a heat-stabilized, heat-set oriented film comprising poly(ethylene naphthalate) as a substrate in, or in the manufacture of, an electronic or opto-electronic device containing a conjugated conductive polymer, wherein said film has a shrinkage at 30 mins at 230° C. of less than 1%; and a composite film comprising such a substrate layer and on a surface thereof a barrier layer.

24 Claims, No Drawings

HEAT-STABILISED POLY(ETHYLENE NAPHTHALATE) FILM FOR FLEXIBLE ELECTRONIC AND OPTO-ELECTRONICS DEVICES

The present invention relates to poly(ethylene naphthalate) (PEN) film suitable for use as a substrate in flexible electronic and opto-electronic devices, particularly electroluminescent (EL) display devices, in particular organic light emitting display (OLED) devices.

Electroluminescent (EL) display is a self-emitting display mode which features excellent visibility (including high brightness, high contrast, very fast response speed and wide viewing angle), an extremely thin profile and very low power consumption. The EL display device itself emits light, as do cathode ray tubes (CRT), fluorescent and plasma displays. Unlike liquid crystal displays (LCDs), there is no need for backlighting. The response speed for EL can be as fast as 1000 times that for LCD, thus making this mode particularly well suited for use with moving images. EL displays may be used in a variety of applications, including aircraft and ship controls, automobile audio equipment, calculators, mobile telephones, portable computers, instrumentation, factory monitors and electronic medical equipment. Another major application for EL displays is as a light source, particularly as backlighting for small LCD panels in order to render them easier to read in low ambient light conditions.

EL displays work by sandwiching a thin film of a phosphorescent or other electroluminescent substance between two plates each of which comprises conductive elements in a predetermined pattern, i.e. electrodes, thereby forming addressable pixels on the display. The electrodes are formed as coatings either on the electroluminescent substance or on a separate support. Where the or each electrode is intended to transmit light, the electrodes are formed as translucent or transparent coatings, for instance using transparent conductive metal oxides. Equally, the or each support may be translucent or transparent, as required. Generally, at least the anode is transparent. The support generally functions both as a base for an electrode and as an insulating layer. The substrate also provides protection against chemical and physical damage in use, storage and transportation. Glass, as well as polymeric film, has been used as the insulating support.

EL display devices have utilised a variety of cathode materials. Early investigations employed alkali metals. Other cathode materials include combinations of metals, such as brass and conductive metal oxides (e.g., indium tin oxide). A variety of single metal cathodes, such as indium, silver, tin, lead, magnesium, manganese, and aluminum, have also been used.

Relatively recent discoveries in EL construction include devices wherein the organic luminescent medium consists of two very thin layers (<1.0 µm in combined thickness) separating the anode and cathode. Representative of OLED devices are those disclosed in, for instance U.S. Pat. No. 4,720,432.

When an electrical current is passed through the conductive elements, the electroluminescent material emits light. EL displays, being an emissive technology, rather than shuttering a light source as per LCD displays, are most useful in applications where high visibility in all light conditions is important.

The development of new, organic electroluminescent materials, which can produce the three primary colours with very high purity, has made possible full-colour displays with uniform levels of brightness and longevity. Polymers having such characteristics can be dissolved in solvents and processed from solution, enabling the printing of electronic devices. Conductive conjugated polymers are of particular interest. As used herein, the term "conjugated conductive polymer" refers to a polymer having pi-electron delocalisation along its backbone. Polymers of this type are reviewed by W. J. Feast in *Polymer*, Vol. 37 (22), 5017–5047, 1996. In a preferred embodiment, the conjugated conductive polymer is selected from:

(i) hydrocarbon conjugated polymers, such as polyacetylenes, polyphenylenes and poly(p-phenylene vinylenes);

(ii) conjugated heterocyclic polymers with heteroatoms in the main chain, such as polythiophenes, polypyrroles and polyanilines; and (iii) conjugated oligomers, such as oligothiophenes, oligopyrroles, oligoanilines, oligophenylenes and oligo(phenylene vinylenes), containing at least two, preferably at least three, preferably at least four, preferably at least five, more preferably 6 or more repeating sub-units.

In addition to use in EL devices, such conjugated conductive polymers have been proposed for use in a variety of other electronic and opto-electronic devices, including photovoltaic cells and semiconductor devices (such as organic field effect transistors, thin film transistors and integrated circuits generally).

The present invention concerns the insulating and supporting substrate of an electronic or opto-electronic device comprising a conjugated conductive polymer, including an EL device (particularly an OLED), a photovoltaic cell and semiconductor devices (such as organic field effect transistors, thin film transistors and integrated circuits generally). The present invention is particularly concerned with the substrate of an optoelectronic device, particularly an EL device (particularly an OLED) or a photovoltaic device, and particularly an EL device (particularly an OLED).

The substrates can be transparent, translucent or opaque, but are typically transparent. The substrates are usually required to meet stringent specifications for optical clarity, flatness and minimal birefringence. Typically, a total light transmission (TLT) of 85% over 400–800 nm coupled with a haze of less than 0.7% is desirable for displays applications. Surface smoothness and flatness are necessary to ensure the integrity of subsequently applied coatings such as the electrode conductive coating. The substrates should also have good barrier properties, i.e. high resistance to gas and solvent permeation. A substrate for use in electronic display applications suitably exhibits water vapour transmission rates of less than $10^{-6}$ g/m$^2$/day and oxygen transmission rates of less than $10^{-5}$/mL/m$^2$/day. Mechanical properties such as flexibility, impact resistance, hardness and scratch resistance are also important considerations.

Optical quality glass or quartz has previously been used in electronic display applications as substrates. These materials are able to meet the optical and flatness requirements and have good thermal and chemical resistance and barrier properties. However, these materials do not have some of the desired mechanical properties, most notably low density, flexibility and impact resistance.

In order to improve the mechanical properties, plastics materials have been proposed as replacements for glass or quartz sheet. Plastic substrates have greater flexibility and improved impact resistance, and are of lighter weight than glass or quartz sheets of equal thickness. In addition, a flexible plastic substrate would allow the printing of electronic devices, for instance using the conjugated polymers referred to above, onto the substrate in a reel-to-reel process, which would reduce cost and allow the manufacture of curved-surface devices. However, the disadvantage of the use of polymeric materials is their lower chemical resistance and inferior barrier properties. Nevertheless, various barrier coatings have been developed to minimise this problem. These coatings are typically applied in a sputtering process at elevated temperatures wherein the density and morphology of the coating can be controlled to give the required barrier properties. A barrier layer may be organic or inorganic, should exhibit good affinity for the layer deposited thereupon, and be capable of forming a smooth surface. Materials which are suitable for use to form a barrier layer are disclosed, for instance, in U.S. Pat. No. 6,198,217. In order to ensure the integrity of the barrier layer and to prevent "pin-pricks" therein, the surface of the polymeric substrate must exhibit good smoothness.

Nevertheless, there remain various limitations with barrier layer-coated plastic substrates. In particular, the use of high temperature techniques, such as sputtering, to deposit the barrier layer means that the polymeric substrate must retain dimensional stability at high temperatures. Many types of polymeric substrate undergo unacceptable dimensional distortion, such as curl, when subjected to the processing conditions, particularly elevated temperature, during the manufacture of display devices. This factor means that only certain types of polymeric film are suitable as substrates in such devices. Furthermore, it has still been necessary to limit the temperatures of the manufacturing process, such as the temperature of the barrier layer deposition process, in order to minimise dimensional instability. Because the quality of the coating layer(s) generally increases with the temperature of the deposition process, it would be desirable to provide a substrate which can be processed at higher temperatures while retaining dimensional stability. In addition, because of the additional barrier layers generally required for a polymeric substrate, it is required to correlate any expansion in the polymeric substrate with any expansion in the barrier coating, thereby avoiding curl and retaining flatness. For these reasons, the expansion characteristics of the substrate are required to be either relatively small or predictable and preferably both.

Manufacturers of equipment which incorporate electronic display devices, particularly handheld equipment such as mobile phones often utilise a test known as "thermal cycling" to assess the performance of the display device. The test involves cyclically exposing the display to temperatures of from about −40° C. to about 80° C., with pre-determined "hold times" at each temperature and certain transition times between temperatures, and is intended to simulate the most extreme operating conditions.

It has been difficult to produce polymeric substrates having the required dimensional stability.

Hitherto, suitable polymeric substrates for electronic display applications have generally been amorphous, cast polymeric films comprising polymers having a relatively high glass transition temperature ($T_g$), such as polyethersulphones and polyimides. Polymers having a high $T_g$ have been favoured since the behaviour of the polymer changes above the $T_g$, in particular the dimensional stability is less predictable and controllable above the $T_g$. Besides the problems associated with producing a film having the requisite dimensional stability and flatness generally, known films may also have a tendency to absorb moisture, which leads to variable and unpredictable expansion characteristics. In addition, films which have been manufactured using solvent-casting techniques may contain residual solvent, and require degassing.

It is an object of this invention to provide a film which overcomes at least one of the aforementioned problems. In particular, it is an object of this invention to provide a polymeric film having good high-temperature dimensional stability suitable for use as a substrate, particularly a flexible substrate, in the manufacture of an electronic or opto-electronic device comprising a conjugated conductive polymer, including an EL device (particularly an OLED), a photovoltaic cell and semiconductor devices (such as organic field effect transistors, thin film transistors and integrated circuits generally). It is a further object to provide a polymeric film having good high-temperature dimensional stability, high optical clarity and good surface smoothness/flatness.

According to the present invention, there is provided the use of a heat-stabilised, heat-set oriented film comprising poly(ethylene naphthalate) as a substrate in, or in the manufacture of, an electronic or opto-electronic device containing a conjugated conductive polymer, wherein said film has a shrinkage at 30 mins at 230° C. of less than 1%, and preferably wherein said film has a residual dimensional change $\Delta L_T$ measured at 25° C. before and after heating the film from 8° C. to 200° C. and then cooling to 8° C., of less than 0.75% of the original dimension.

As used herein, a device containing a conjugated conductive polymer preferably refers to an EL device (particularly an OLED), a photovoltaic cell and semiconductor devices (such as organic field effect transistors, thin film transistors and integrated circuits generally). As used herein, an opto-electronic device containing a conjugated conductive polymer preferably refers to an EL device (particularly an OLED) and a photovoltaic device, and particularly an EL device (particularly an OLED). As used herein, the term electronic device containing a conjugated conductive polymer excludes opto-electronic devices and preferably refers to semiconductor devices such as organic field effect transistors, thin film transistors and integrated circuits generally, and particularly organic field effect transistors.

It is unexpected that PEN is suitable as a substrate for such applications due to its low $T_g$ (approximately 120° C.) relative to the temperatures commonly used in the manufacture of the said devices and relative to the $T_g$s of polymers previously used in this application. A particular advantage of the heat-stabilised, oriented PEN film is that it allows for a relatively high temperature to be used during the deposition of the barrier layer(s). In addition, it is possible to achieve PEN film surfaces having high clarity and good surface smoothness. A further advantage of PEN film, relative to polyethylene terephthalate (PET) film for example, is its lower water vapour transmission rate and its lower oxygen transmission rate. PEN film has been found to be advantageous over the amorphous high Tg polymeric films discussed above by virtue of its significantly lower moisture uptake.

The film preferably has a shrinkage at 30 mins at 230° C. of less than 0.75%, preferably less than 0.5%, and more preferably less than 0.25%. In one embodiment, the film has a shrinkage at 30 minutes at 230° C. of less than 0.1%. The residual dimensional change $\Delta L_T$ measured at 25° C. before and after heating the film from 8° C. to 200° C. and then cooling to 8° C., is preferably less than 0.5%, preferably less than 0.25%, and more preferably less than 0.1% of the original dimension. Preferably, the film has a coefficient of linear thermal expansion (CLTE) within the temperature range from −40° C. to +100° C. of less than $40 \times 10^{-6}/°$ C., preferably less than $30 \times 10^{-6}/°$C, more preferably less than $25 \times 10^{-6}/°$ C., more preferably less than $20 \times 10^{-6}/°$ C.

The film is self-supporting by which is meant capable of independent existence in the absence of a supporting base.

The thickness of the film is preferably between about 12 and 300 μm, more preferably between about 25 and 250 μm, more preferably between about 50 and 250 μm.

The PEN polyester can be synthesised by conventional methods. A typical process involves a direct esterification or ester exchange reaction, followed by polycondensation. Thus, PEN polyester may be obtained by condensing 2,5-, 2,6- or 2,7-naphthalenedicarboxylic acid, preferably 2,6-naphthalenedicarboxylic acid, or a lower alkyl (up to 6 carbon atoms) diester thereof, with ethylene glycol. Typically, polycondensation includes a solid phase polymerisation stage. The solid phase polymerisation may be carried out on a fluidised bed, e.g. fluidised with nitrogen, or on a vacuum fluidised bed, using a rotary vacuum drier. Suitable solid phase polymerisation techniques are disclosed in, for example, EP-A-0419400 the disclosure of which is incorporated herein by reference.

In a preferred embodiment, the PEN is prepared using germanium catalysts which provide a polymeric material having a reduced level of contaminants such as catalyst residues, undesirable inorganic deposits and other byproducts of the polymer manufacture. As a result of the "cleaner" polymeric composition, a film manufactured therefrom will exhibit improved optical clarity and surface smoothness.

The PEN used to prepare the film according to the invention suitably has a PET-equivalent intrinsic viscosity (IV; measured as described herein) of 0.5–1.5, preferably 0.7–1.5, and in particular 0.79–1.0. An IV of less than 0.5 results in a polymeric film lacking desired properties such as mechanical properties whereas an IV of greater than 1.5 is difficult to achieve and would likely lead to processing difficulties of the raw material.

Formation of the substrate may be effected by conventional techniques well-known in the art. Conveniently, formation of the substrate is effected by extrusion, in accordance with the procedure described below. In general terms the process comprises the steps of extruding a layer of molten polymer, quenching the extrudate and orienting the quenched extrudate in at least one direction.

The substrate may be uniaxially-oriented, but is preferably biaxially-oriented. Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties.

In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation.

In the preferred flat film process, the substrate-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Alternatively, orientation may be generated in the extruded film by way of simultaneous stretching. Here, the film is stretched in the longitudinal and transverse directions in what is essentially the same stage of the process, in the stenter oven. For both routes of sequential and simultaneous stretching, the extent of stretching is determined partly by the nature of the polyester. However the film is usually stretched so that the dimension of the oriented film is from 2 to 5, more preferably 2.5 to 4.5 times its original dimension in each direction of stretching. Typically, stretching is effected at temperatures in the range of 70 to 150° C., typically 70 to 140° C. Greater draw ratios (for example, up to about 8 times) may be used if orientation in only one direction is required. It is not necessary to stretch equally in the machine and transverse directions although this is preferred if balanced properties are desired.

The stretched film is dimensionally stabilised by heat-setting under dimensional restraint at a temperature above the glass transition temperature of the polyester but below the melting temperature thereof, to induce crystallisation of the polyester, as described in GB-A-838708. The tension of dimensional restraint is generally in the range of about 19 to about 75 kg/m, preferably about 45 to about 50 kg/m of film width which, for a film having a width of about 2.6 m is a tension in the range of about 50 to about 190 kg, preferably in the range of 120–130 kg. The actual heat-set temperature and time will vary depending on the composition of the film but should be selected so as not to substantially degrade the tear resistant properties of the film. Within these constraints, a heat-set temperature of about 135° to 250° C. is generally desirable, more preferably 235–240° C. The duration of heating will depend on the temperature used but is typically in the range of 5 to 40 secs, preferably 8 to 30 secs.

The completed film is then further heat-stabilised by heating it under low tension (i.e. with the minimum possible dimensional restraint) at a temperature above the glass transition temperature of the polyester but below the melting point thereof, in order to allow the majority of the inherent shrinkage in the film to occur (relax out) and thereby produce a film with very low residual shrinkage and consequently high dimensional stability. The tension experienced by the film during this heat-stabilisation step is typically less than 5 kg/m, preferably less than 3.5 kg/m, more preferably in the range of from 1 to about 2.5 kg/m, and typically in the range of 1.5 to 2 kg/m of film width. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135° C. to 250° C. is generally desirable, preferably 190 to 250° C., more preferably 200 to 230° C., and more preferably at least 215° C., typically 215 to 230° C. The duration of heating will depend on the temperature used but is typically in the range of 10 to 40 sec, with a duration of 20 to 30 secs being preferred. This heat stabilisation process can be carried out by a variety of methods, including flat and vertical configurations and either "off-line" as a separate process step or "in-line" as a continuation of the film manufacturing process. In one embodiment, heat stabilisation is conducted "off-line".

The substrate may comprise one or more discrete layers. The composition of the respective layers may be the same or different. For instance, the substrate may comprise one, two, three, four or five or more layers and typical multi-layer structures may be of the AB, ABA, ABC, ABAB, ABABA or ABCBA type. Preferably, the substrate comprises only one layer. Where the substrate comprises more than one layer, preparation of the substrate is conveniently effected by coextrusion, either by simultaneous coextrusion of the respective film-forming layers through independent orifices of a multi-orifice die, and thereafter uniting the still molten layers, or, preferably, by single-channel coextrusion in which molten streams of the respective polymers are first united within a channel leading to a die manifold, and thereafter extruded together from the die orifice under conditions of streamline flow without intermixing thereby to produce a multi-layer polymeric film, which may be oriented and heat-set as hereinbefore described. Formation of a multi-layer substrate may also be effected by conventional lamination techniques, for example by laminating together a preformed first layer and a preformed second layer, or by casting, for example, the first layer onto a preformed second layer.

The polymeric film may conveniently contain any of the additives conventionally employed in the manufacture of polymeric films. Thus, agents such as cross-linking agents, dyes, pigments, voiding agents, lubricants, anti-oxidants, radical scavengers, UV absorbers, thermal stabilisers, flame retardants, anti-blocking agents, surface active agents, slip aids, optical brighteners, gloss improvers, prodegradents, viscosity modifiers and dispersion stabilisers may be incorporated as appropriate. In particular, a layer may comprise a particulate filler which can improve handling and windability during manufacture. The particulate filler may, for example, be a particulate inorganic filler or an incompatible resin filler or a mixture of two or more such fillers.

By an "incompatible resin" is meant a resin which either does not melt, or which is substantially immiscible with the polymer, at the highest temperature encountered during extrusion and fabrication of the film. The presence of an incompatible resin usually results in a voided layer, by which is meant that the layer comprises a cellular structure containing at least a proportion of discrete, closed cells. Suitable incompatible resins include polyamides and olefin polymers, particularly a homo- or co-polymer of a mono-alpha-olefin containing up to 6 carbon atoms in its molecule. Preferred materials include a low or high density olefin homopolymer, particularly polyethylene, polypropylene or poly-4-methylpentene-1, an olefin copolymer, particularly an ethylene-propylene copolymer, or a mixture of two or more thereof. Random, block or graft copolymers may be employed.

Particulate inorganic fillers include conventional inorganic fillers, and particularly metal or metalloid oxides, such as alumina, silica (especially precipitated or diatomaceous silica and silica gels) and titania, calcined china clay and alkaline metal salts, such as the carbonates and sulphates of calcium and barium. Glass particles may also be used. The particulate inorganic fillers may be of the voiding or non-voiding type. Suitable particulate inorganic fillers may be homogeneous and consist essentially of a single filler material or compound, such as titanium dioxide or barium sulphate alone. Alternatively, at least a proportion of the filler may be heterogeneous, the primary filler material being associated with an additional modifying component. For example, the primary filler particle may be treated with a surface modifier, such as a pigment, soap, surfactant coupling agent or other modifier to promote or alter the degree to which the filler is compatible with the substrate layer polyester.

Preferred particulate inorganic fillers include titanium dioxide and silica.

Titanium dioxide particles may be of anatase or rutile crystal form. The titanium dioxide particles preferably comprise a major portion of rutile, more preferably at least 60% by weight, particularly at least 80%, and especially approximately 100% by weight of rutile. The particles can be prepared by standard procedures, such as the chloride process or the sulphate process. The titanium dioxide particles may be coated, preferably with inorganic oxides such as aluminium, silicon, zinc, magnesium or mixtures thereof. Preferably the coating additionally comprises organic compound(s), such as fatty acids and preferably alkanols, suitably having from 8 to 30, preferably from 12 to 24 carbon atoms. Polydiorganosiloxanes or polyorganohydrogensiloxanes, such as polydimethylsiloxane or polymethylhydrogensiloxane are suitable organic compounds. The coating is suitably applied to the titanium dioxide particles in aqueous suspension. The inorganic oxides are precipitated in aqueous suspension from water-soluble compounds such as sodium aluminate, aluminium sulphate, aluminium hydroxide, aluminium nitrate, silicic acid or sodium silicate. The coating layer on the titanium dioxide particles is preferably in the range from 1 to 12% of inorganic oxides, and preferably in the range from 0.5 to 3% of organic compound, by weight based upon the weight of titanium dioxide.

The inorganic filler should be finely-divided, and the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 7.0 µm, more preferably 0.05 to 4.5 µm, and particularly 0.15 to 1.5 µm.

The size distribution of the inorganic filler particles is also an important parameter, for example the presence of excessively large particles can result in the film exhibiting unsightly 'speckle', i.e. where the presence of individual filler particles in the film can be discerned with the naked eye. It is preferred that none of the inorganic filler particles should have an actual particle size exceeding 30 µm. Particles exceeding such a size may be removed by sieving processes which are known in the art. However, sieving operations are not always totally successful in eliminating all particles greater than a chosen size. In practice, therefore, the size of 99.9% by number of the inorganic filler particles should not exceed 30 µm, preferably should not exceed 20 µm, and more preferably should not exceed 10 µm. Preferably at least 90%, more preferably at least 95% by volume of the inorganic filler particles are within the range of the mean particle size ±3.0 µm, and particularly ±2.5 µm.

Particle size of the filler particles may be measured by electron microscope, coulter counter, sedimentation analysis and static or dynamic light scattering. Techniques based on laser light diffraction are preferred. The median particle size may be determined by plotting a cumulative distribution curve representing the percentage of particle volume below chosen particle sizes and measuring the 50th percentile.

The components of the film may be mixed together in a conventional manner. For example, by mixing with the monomeric reactants from which the layer polymer is derived, or the components may be mixed with the polymer by tumble or dry blending or by compounding in an extruder, followed by cooling and, usually, comminution into granules or chips. Masterbatching technology may also be employed.

In a preferred embodiment, the film of the present invention is optically clear, preferably having a % of scattered visible light (haze) of <3.5%, preferably <2%, more preferably <1.5%, more preferably ≦1%, and particularly less than 0.7%, measured according to the standard ASTM D 1003. In one embodiment, the haze is in the range of 0.6 to 1%. Preferably the total light transmission (TLT) in the range of 400–800 nm is at least 75%, preferably at least 80%, and more preferably at least 85%, measured according to the standard ASTM D 1003. In this embodiment, filler is typically present in only small amounts, generally not exceeding 0.5% and preferably less than 0.2% by weight of a given layer.

In one embodiment, the film is not only optically clear as defined above but also demonstrates good handleability and windability. In this embodiment, the film comprises about 50 to 1000 ppm of glass particles having a volume distributed median particle diameter of 1.0 to 7.0 μm, and about 200 to 2000 ppm of silica particles having an average primary particle size (by which is meant the number average particle diameter) of 0.01 to 0.09 μm. The glass particles are preferably solid glass beads, preferably being of substantially circular cross-section irrespective of the selected viewing point. Desirably, an individual glass particle exhibits an aspect ratio $d_1:d_2$ (where $d_1$ and $d_2$, respectively, are the maximum and minimum dimensions of the particle) in a range of from 1:1 to 1:0.5, preferably from 1:1 to 1:0.8, and especially from 1:1 to 1:0.9. The glass particles are not limited by their chemical composition, but preferably comprise crown glass and/or borosilicate glass. The silica particles are preferably of substantially circular cross-section irrespective of the selected viewing point. Desirably, a typical primary silica particle exhibits an aspect ratio $d_1:d_2$ in a range of from 1:1 to 1:0.5, and preferably from 1:1 to 1:0.8. Further embodiments of glass and silica-containing layers are described in U.S. Pat. No. 5,328,755, the disclosure of which is incorporated herein by reference.

In an alternative embodiment, the film is opaque and highly filled, preferably exhibiting a Transmission Optical Density (TOD) (Sakura Densitometer; type PDA 65; transmission mode) in the range from 0.1 to 2.0, more preferably 0.2 to 1.5, more preferably from 0.25 to 1.25, more preferably from 0.35 to 0.75 and particularly 0.45 to 0.65. The film is conveniently rendered opaque by incorporation into the polymer blend of an effective amount of an opacifying agent. Suitable opacifying agents include an incompatible resin filler, a particulate inorganic filler or a mixture of two or more such fillers, as hereinbefore described. The amount of filler present in a given layer is preferably in the range from 1% to 30%, more preferably 3% to 20%, particularly 4% to 15%, and especially 5% to 10% by weight, based on the weight of the layer polymer.

The surface of an opaque film preferably exhibits a whiteness index, measured as herein described, in the range from 60 to 120, more preferably 80 to 110, particularly 90 to 105, and especially 95 to 100 units.

The PEN film may further comprise one or more additional polymeric layers or coating materials. Any coating is preferably performed "in-line".

In one embodiment, on one side of the film an additional coating may comprise a "slip coating" in order to improve the handling and windability of the film. A suitable slip coating may be, for instance a discontinuous layer of an acrylic and/or methacrylic polymeric resin optionally further comprise a cross-linking agent, such as described in EP-A-0408197, the disclosure of which is incorporated herein by reference. An alternative slip coating may comprise a potassium silicate coating, for instance as disclosed in U.S. Pat. Nos. 5,925,428 and 5,882,798, the disclosures of which are incorporated herein by reference.

In one embodiment, the film is coated with a primer layer which improves adhesion of the film to a subsequently applied layer. The identity and nature of the primer or adherent layer will depend on the identity of the subsequently applied layer but typically may be selected from an acrylate or methacrylate polymer resin. Suitable materials include:

(i) a copolymer of (a) 35 to 40 mole % alkyl acrylate, (b) 35 to 40% alkyl methacrylate, (c) 10 to 15 mole % of a comonomer containing a free carboxyl group such as itaconic acid, and (d) 15 to 20 mole % of an aromatic sulphonic acid and/or salt thereof such as p-styrene sulphonic acid, an example of which is a copolymer comprising ethyl acrylate/methyl methacrylate/itaconic acid/p-styrene sulphonic acid and/or a salt thereof in a ratio of 37.5/37.5/10/15 mole %, as disclosed in EP-A-0429179 the disclosure of which is incorporated herein by reference; and (ii) an acrylic and/or methacrylic polymeric resin, an example of which is a polymer comprising about 35 to 60 mole % ethyl acrylate, about 30 to 55 mole % methyl methacrylate and about 2 to 20 mole % methacrylamide, as disclosed in EP-A-0408197 the disclosure of which is incorporated herein by reference.

The primer or adherent layer may also comprise a cross-linking agent which functions to cross-link the composition to improve adhesion to a substrate and should also be capable of internal cross-linking within the composition. Suitable cross-linking agents include optionally alkoxylated condensation products of melamine with formaldehyde. The primer or adherent layer may also comprise a cross-linking catalyst, such as ammonium sulphate, to facilitate the cross-linking of the cross-linking agent. Other suitable cross-linking agents and catalysts are disclosed in EP-A-0429179, the disclosures of which are incorporated herein by reference.

In use, the film will also be coated with a barrier layer, as noted above. Such coatings are known in the art and are typically applied in a sputtering process at elevated temperatures. Materials which are suitable for use to form a barrier layer are disclosed, for instance, in U.S. Pat. No. 6,198,217. An organic barrier layer may be formed from, for instance, photocurable monomers or oligomers, or thermoplastic resins. Photocurable monomers or oligomers should have low volatility and high melting points. Examples of such monomers include trimethylol acrylates such as trimethylolpropane triacrylate, ditrimethylolpropane tetraacrylate and the like; long-chain acrylates such as 1,6-hexanediol diacrylate, 1,6-hexanediol dimethacrylate and the like; and cyclohexyl acrylates such as dicyclopentenyloxyethyl acrylate, dicyclopentenyloxy acrylate, cyclohexyl methacrylate and the like. Examples of such oligomers include acrylate oligomers, epoxy acrylate oligomers, urethane acrylate oligomers, ether acrylate oligomers, and the like. Photoinitiators, such as benzoin ethers, benzophenones, acetophenones, ketals and the like, may be used to cure the resin. Examples of suitable thermoplastic resins include polyethylene, polymethyl methacrylate, polyethylene terephthalate and the like. These organic materials may be applied by any conventional technique known in the art, such as by vacuum deposition.

An inorganic barrier layer should be made of a material which exhibits low moisture permeability and is stable against moisture. Examples include oxides such as $SiO_2$, SiO, GeO, $Al_2O_3$ and the like, nitrides such as TiN, $Si_3N_4$ and the like, and metals such as Al, Ag, Au, Pt, Ni and the like. The inorganic material may be applied using a vapour phase technique such as vacuum deposition, sputtering and the like under standard conditions.

A barrier layer can itself comprise one or more discrete layers, and may comprise one or more organic layer(s) and one or more inorganic layer(s).

In a preferred embodiment, the barrier layer is a layer which reduces the water vapour transmission rate of the substrate in an opto-electronic device to less than $10^{-6}$ g/m²/day and the oxygen transmission rate to less than $10^{-5}$/mL/m²/day. In an alternative embodiment, the barrier layer is a layer which reduces the water vapour transmission rate of the substrate in an electronic device to less than $10^{-2}$ g/m²/day (preferably less than $10^{-6}$ g/m²/day) and the oxygen transmission rate to less than $10^{-3}$/mL/m² day (preferably less than $10^{-5}$/mL/m²/day).

Once the barrier layer has been deposited, subsequent layers, including the electrode and conductive conjugated polymer, may be applied in accordance with conventional manufacturing techniques known in the art. The electrode may be any suitable electrode known in the art, for instance an electrode selected from those mentioned herein. In one embodiment, the electrode is a conductive metal oxide, preferably indium tin oxide.

The electronic and opto-electronic devices referred to generally herein comprise one (or more) layers of conductive conjugated polymer, two or more electrodes, and one or more substrate layers.

In one embodiment of the invention, the term electroluminescent display device, particularly an organic light emitting display (OLED) device, refers to a display device comprising a layer of light-emitting conductive conjugated polymeric material disposed between two layers each of which comprises an electrode, wherein the resultant composite structure is disposed between two substrate (or support or cover) layers.

In one embodiment of the invention, the term photovoltaic cell refers to a device comprising a layer of conductive conjugated polymeric material disposed between two layers each of which comprises an electrode, wherein the resultant composite structure is disposed between two substrate (or support or cover) layers.

In one embodiment of the invention, the term transistor refers to a device comprising at least one layer of conductive conjugated polymer, a gate electrode, a source electrode and a drain electrode, and one or more substrate layers.

According to a further aspect of the present invention, there is provided a composite film comprising a substrate layer and on a surface thereof a barrier layer, wherein said substrate is a heat-stabilised, heat-set, oriented film comprising poly(ethylene naphthalate) having a shrinkage at 30 mins at 230° C. of less than 1%; preferably a residual dimensional change $\Delta L_T$ measured at 25° C. before and after heating the film from 8° C. to 200° C. and then cooling to 8° C., of less than 0.75% of the original dimension; and preferably a coefficient of linear thermal expansion (CLTE) within the temperature range from −40° C. to +100° C. of less than $40 \times 10^{-6}$/° C. In one embodiment, said substrate is obtainable by a process comprising the steps of:

(i) forming a layer comprising poly(ethylene naphthalate);

(ii) stretching the layer in at least one direction;

(iii) heat-setting under dimensional restraint at a tension in the range of about 19 to about 75 kg/m of film width at a temperature above the glass transition temperature of the polyester but below the melting temperature thereof; and (iv) heat-stabilising under a tension of less than 5 kg/m of film width, and at a temperature above the glass transition temperature of the polyester but below the melting temperature thereof.

According to a further aspect of the present invention, there is provided a composite film comprising a substrate layer as described herein and on a surface thereof a barrier layer as described herein, and further comprising an electrode layer on at least part of the surface of the barrier layer, and optionally further comprising a layer of conjugated conductive polymer.

According to a further aspect of the present invention, there is provided a method for the manufacture of an electronic or opto-electronic device containing a conjugated conductive polymer and a substrate as described herein, said process comprising the steps of:

(i) forming a substrate layer comprising poly(ethylene naphthalate);

(ii) stretching the layer in at least one direction;

(iii) heat-setting under dimensional restraint at a tension in the range of about 19 to about 75 kg/m, preferably about 45 to about 50 kg/m of film width, at a temperature above the glass transition temperature of the polyester but below the melting temperature thereof;

(iv) heat-stabilising under low tension, preferably at a tension of less than 5 kg/m, more preferably at a tension of less than 3.5 kg/m, more preferably at a tension in the range of 1.0 to 2.5 kg/m, and typically at a tension in the range of 1.5 to 2.0 kg/m of film width, and at a temperature above the glass transition temperature of the polyester but below the melting temperature thereof; and (v) providing the heat-stabilised, heat-set, oriented film as a substrate in the device.

Steps in the manufacture of the electronic or opto-electronic device may further comprise coating the heat-stabilised, heat-set, oriented film substrate with a barrier layer; providing an electrode by applying a conductive material onto at least part of the barrier layer; and providing a layer of a conductive conjugated polymer.

The following test methods may be used to determine certain properties of the polymeric film:

(i) film clarity may be evaluated by measuring total luminance transmission (TLT) and haze (% of scattered transmitted visible light) through the total thickness of the film using a Gardner XL 211 hazemeter in accordance with ASTM D-1003-61.

(ii) Transmission Optical Density (TOD) of the film may be measured using a Macbeth Densitometer TR 927 (Dent & Woods Ltd, Basingstoke, UK) in transmission mode.

(iii) Dimensional stability may be assessed in terms of either
(a) the coefficient of linear thermal expansion (CLTE) or
(b) a temperature cycling method wherein the residual change in length along a given axis is measured after heating the film to a given temperature and subsequently cooling the film.

Both methods of measurements were conducted using a Thermomechanical Analyser PE-TMA-7 (Perkin Elmer) calibrated and checked in accordance with known procedures for temperature, displacement, force, eigendeformation, baseline and furnace temperature alignment. The films were examined using extension analysis clamps. The baseline required for the extension clamps was obtained using a very low coefficient of expansion specimen (quartz) and the CLTE precision and accuracy (dependent on post-scan baseline subtraction) was assessed using a standard material, e.g. pure aluminium foil, for which the CLTE value is well known. The specimens, selected from known axes of orientation within the original film samples, were mounted in the system using a clamp separation of approx. 12 mm and subjected to an applied force of 75 mN over a 5 mm width. The applied force was adjusted for changes in film thickness, i.e. to ensure consistent tension, and the film was not curved along the axis of analysis. Specimen lengths were normalised to the length measured at a temperature of 23° C.

In the CLTE test method (a), specimens were cooled to 8° C., stabilised, then heated at 5° C./min from 8° C. to +240° C. The CLTE values (a) were derived from the formula:

$$\alpha = \Delta L/(L \times (T_2 - T_1))$$

where $\Delta L$ is the measured change in length of the specimen over the temperature range $(T_2-T_1)$, and L is the original specimen length at 23° C. CLTE values are considered reliable up to the temperature of the Tg (120° C.).

The data can be plotted as a function of the % change in specimen length with temperature, normalised to 23° C.

In the temperature cycling test method (b), a procedure similar to that of method (a) was used wherein the temperature was cycled between 8° C. and several elevated temperatures. Thus, film samples were heated from 8° C. to 140° C., 160° C., 180° C. or 200° C. and then cooled to 8° C. The length along each of the transverse and machine directions was measured at 25° C. before and after this heat treatment and the change in length $\Delta L_T$ calculated as percentage of the original length. The results are shown in Table 2.

(iv) Intrinsic Viscosity (IV) was measured by melt viscometry, using the following procedure. The rate of flow pre-dried extrudate through a calibrated die at known temperature and pressure is measured by a transducer which is linked to a computer. The computer programme calculates melt viscosity values ($\log_{10}$ viscosity) and equivalent IVs from a regression equation determined experimentally. A plot of the IV against time in minutes is made by the computer and the degradation rate is calculated. An extrapolation of the graph to zero time gives the initial IV and equivalent melt viscosity. The die orifice diameter is 0.020 inches, with a melt temperature of 284° C. for IV up to 0.80, and 295° C. for IV>0.80.

(v) Shrinkage at a given temperature is measured by placing the sample in a heated oven for a given period of time. The % shrinkage is calculated as the % change of dimension of the film in a given direction before and after heating.

(vi) Surface Roughness was measured using conventional non-contacting, white-light, phase-shifting interferometry techniques, which are well-known in the art. The instrument used was a Wyko NT3300 surface profiler. Useful characterising data obtainable using the technique include:

Roughness Average (Ra): the arithmetic average peak height calculated over the measured surface area.

Root Mean Square Roughness (Rq): the root mean square average peak height calculated over the measured surface area.

Maximum Profile Peak Height (Rp): the height of the highest peak in the measured surface area.

Average Maximum Profile Peak Height (Rpm): the average value of the ten highest peaks in the measured surface area.

The roughness parameters and peak heights are measured relative to the average level of the sample surface area, or "mean line", in accordance with conventional techniques. (A polymeric film surface may not be perfectly flat, and often has gentle undulations across its surface. The mean line is a straight line that runs centrally through undulations and surface height departures, dividing the profile such that there are equal areas above and below the mean line.)

The surface profile analysis is conducted by scanning discrete regions of the film surface within the "field of view" of the surface profiler machine, which is the area scanned in a single measurement. A film sample may be analysed using a discrete field of view, or by scanning successive fields of view to form an array. The analyses conducted herein utilised the full resolution of the Wyko NT3300 surface profiler, in which each field of view comprises 736×480 pixels.

For the measurement of Ra and Rq, the resolution was enhanced using an objective lens having a 50-times magnification. The resultant field of view has dimensions of 90 μm×120 μm, with a pixel size of 0.163 μm.

For the measurement of Rp and Rpm, the resolution is conveniently enhanced using an objective lens having a 10-times magnification in combination with a "0.5-times field of view of multiplier" to give a total magnification of 5-times. The resultant field of view has dimensions of 0.9 mm×1.2 mm, with a pixel size of 1.63 μm.

For each measurement, the results of five successive scans are combined to give an average value. The measurements were conducted using a modulation threshold (signal: noise ratio) of 10%, i.e. data points below the threshold are discarded.

It is preferred that the films of the present invention have an Ra value, as measured herein, of less than 0.8, preferably less than 0.7, preferably less than 0.65, and most preferably less than 0.6 nm. It is preferred that the films of the present invention have an Rq value, as measured herein, of 1.0 nm or lower, preferably 0.9 nm or lower, preferably 0.85 nm or lower, most preferably 0.75 nm or lower.

(vii) Oxygen transmission rate can be measured using ASTM D3985.

(viii) Water vapour transmission rate can be measured using ASTM F1249.

(ix) Whiteness index of the film's external surface is measured using a Colorgard System 2000, Model/45 (Pacific Scientific) in accordance with ASTM D313.

The invention is further illustrated by the following examples. It will be appreciated that the examples are for illustrative purposes only and are not intended to limit the invention as described above. Modification of detail may be made without departing from the scope of the invention.

EXAMPLES

Example 1

Dimethyl naphthalate was reacted with ethylene glycol in the presence of 400 ppm manganese acetate tetrahydrate catalyst to give bis-(2-hydroxyethyl) naphthalate and low oligomers thereof, in a standard ester interchange reaction. At the end of the ester interchange reaction 0.025% of phosphoric acid stabiliser was added, followed by 0.04% of antimony trioxide polycondensation catalyst. A standard batch polycondensation reaction was performed until the intrinsic viscosity (IV) of the polyethylene naphthalate was approximately 0.50–0.675 (true PEN IV; PET equivalent IV 0.75–1.00).

A polymer composition comprising PEN was extruded and cast onto a hot rotating polished drum. The film was then fed to a forward draw unit where it was stretched over a series of temperature-controlled rollers in the direction of extrusion to approximately 3.34 times its original dimensions. The draw temperature was approximately 133° C. The film was then passed into a stenter oven at a temperature of 138° C. where the film was stretched in the sideways direction to approximately 4.0 times its original dimensions. The biaxially stretched film was then heat-set at temperatures up to about 238° C. by conventional means before being cooled and wound onto reels. The total film thickness was 125 µm.

The heat-set biaxially stretched film was then unwound and passed through a series of four flotation ovens and allowed to relax by applying the minimum line tension compatible with controlling the transport of the web. The heat-stabilised film was then wound up. Each of the four ovens had three controlled temperature zones in the transverse direction (left, centre and right):

|  | Left | Centre | Right |
|---|---|---|---|
| Oven 1 | 200 | 210 | 200 |
| Oven 2 | 200 | 210 | 200 |
| Oven 3 | 200 | 210 | 200 |
| Oven 4 | 195 | 205 | 195 |

The line speed of the film during the heat-stabilisation step was 15 m/min. The tensions used for the film (1360 mm original roll width) were 24–25N.

Example 2

The procedure of Example 1 was repeated using the following temperatures in the heat stabilisation step:

|  | Left | Centre | Right |
|---|---|---|---|
| Oven 1 | 223 | 230 | 223 |
| Oven 2 | 223 | 230 | 223 |
| Oven 3 | 223 | 230 | 223 |
| Oven 4 | 218 | 225 | 218 |

Example 3

Dimethyl naphthalate was reacted with ethylene glycol (2.1:1 glycol:ester mole ratio) in the presence of 400 ppm manganese acetate catalyst to give bis-(2-hydroxyethyl) naphthalate and low oligomers thereof, in a standard ester interchange reaction. At the end of the ester interchange reaction 0.025% of phosphoric acid stabiliser was added, followed by 0.020% of germanium dioxide polycondensation catalyst (133 ppm Ge metal). A standard batch polycondensation reaction was performed until the intrinsic viscosity (IV) of the polyethylene naphthalate was approximately 0.50–0.675 (true PEN IV; PET equivalent IV 0.75–1.00). The resultant polyester was used to manufacture a film in accordance with the general procedure described for Example 1.

Example 4

Dimethyl naphthalate was reacted with ethylene glycol in the presence of 210 ppm manganese acetate tetrahydrate catalyst to give bis-(2-hydroxyethyl) naphthalate and low oligomers thereof, in a standard ester interchange reaction. At the end of the ester interchange reaction 0.025 wt % of phosphoric acid stabiliser was added, followed by 0.036 wt % of antimony trioxide polycondensation catalyst. A standard batch polycondensation reaction was performed until the intrinsic viscosity (IV) of the polyethylene naphthalate was approximately in the range 0.50–0.675 (true PEN IV; PET equivalent IV 0.75–1.0). The polyester was used to manufacture a film according to the procedure of Example 1 except that the forwards stretching was conducted at a draw ratio of 3.1 and a temperature of 150–155° C.; the transverse stretching was conducted at a draw ratio of 3.5 and a temperature of 145° C.; and the heat set temperature was 234° C. The final film thickness was 125 µm and the haze was 0.6%.

The shrinkages of the films of Examples 1 and 2 were analysed using the test described herein and the results are shown in Table 1. A PEN film manufactured in the same manner as Example 1, but without heat-stabilisation, was used as the control (Control 1).

TABLE 1

Film Shrinkage

| | Shrinkage (%) at 30 mins at 230° C. | |
|---|---|---|
| Sample | MD | TD |
| Control 1 | 3.0 | 1.38 |
| Example 1 | 0.43 | 0.43 |
| Example 2 | 0.07 | 0.1 |

The results in Table 1 show that the heat-stabilised, heat-set film has good dimensional stability even at relatively high temperatures. The results also show the improved shrinkage properties of higher temperature heat-stabilisation (Example 2).

The films of Example 3 and 4 were analysed using the dimensional stability test method (iii)(b) described above. A PEN film manufactured in the same manner as Example 4, but without heat-stabilisation, was used as the control (Control 2). Measurements were taken along the transverse direction (TD) and machine direction (MD) of the film. A negative value represents film shrinkage. The results are shown in Table 2.

TABLE 2

Residual change in specimen length $\Delta L_r$

| | | $\Delta L_r$ | | | |
|---|---|---|---|---|---|
| Sample | Axis | at 140° C. | at 160° C. | At 180° C. | at 200° C. |
| Example 3 | MD | −0.07 | −0.07 | −0.08 | −0.2 |
| | TD | 0.07 | 0.11 | 0.13 | −0.2 |
| Example 4 | MD | 0.01 | 0.01 | −0.01 | −0.1 |
| | TD | 0.06 | 0.1 | 0.15 | 0.03 |
| Control 2 | MD | −0.3 | −0.43 | −0.58 | −0.9 |
| | TD | −0.12 | −0.23 | −0.41 | −0.8 |

The data in Table 2 demonstrate that heat-stabilised PEN film exhibits only a very small permanent dimensional change when exposed to high temperatures. Such film therefore possesses advantageous and predictable properties with respect to dimensional stability as a function of temperature and would be suitable as a substrate in an electronic display. In contrast, PEN film which has not been heat-stabilised exhibits shrinkage and expansion effects which result in relatively larger permanent deformations of the film, particularly following the initial heating stage.

The surface roughness of the films was also measured using the procedure described herein, and the results are shown in Table 3.

TABLE 3

| Surface Roughness | | |
|---|---|---|
| | Example 1 | Example 3 |
| Average Roughness (Ra) | 0.64 nm | 0.63 nm |
| Root Mean Square Roughness (Rq) | 0.90 nm | 0.82 nm |

The results in Table 3 show that a superior smoothness is obtained with the Ge-catalysed polyester.

The invention claimed is:

1. An electronic device containing a conjugated conductive polymer and a substrate comprising a heat stabilized, heat-set oriented film comprising poly(ethylene naphthalate) as a substrate wherein said film has a shrinkage at 30 mins at 230° C. of less than 1%, said device being one of an optoelectronic device, electroluminescent display device, light emmitting display device, photovoltaic cell or semi-conductor device.

2. An electronic or optoelectronic device containing a conjugated conductive polymer and a substrate comprising a heat stabilized, heat-set oriented film comprising poly(ethylene naphthalate) as a substrate wherein said film has a shrinkage at 30 mins at 230° C. of less than 1%, and wherein said substrate has a residual dimensional change $\Delta L_T$, measured at 25° C. before and after heating from 8° C. to 200° C. and then cooling to 8° C., of less than 0.75% of the original dimension.

3. An electronic or optoelectronic device containing a conjugated conductive polymer and a substrate comprising a heat stabilized, heat-set oriented film comprising poly(ethylene naphthalate) as a substrate wherein said film has a shrinkage at 30 mins at 230° C. of less than 1%, wherein said substrate has a coefficient of linear thermal expansion (CLTE) within the temperature range from −40° C. to +100° C. of less than $40 \times 10^{-6}/°$ C.

4. A composite film comprising a substrate layer and on a surface thereof a barrier layer, wherein said substrate is a heat-stabilized, heat-set, oriented film comprising poly(ethylene naphthalate) having a shrinkage at 30 mins at 230° C. of less than 1% and a residual dimensional change $\Delta L_T$, measured at 25° C. before and after heating from 8° C. to 200° C. and then cooling to 8° C., of less than 0.75% of the original dimension.

5. A composite film comprising a substrate layer and on a surface thereof a barrier layer, wherein said substrate is a heat-stabilized, heat-set, oriented film comprising poly(ethylene naphthalate) having a shrinkage at 30 mins at 230° C. of less than 1% and wherein said substrate has a coefficient of linear thermal expansion (CLTE) within the temperature range from −40° C. to +100° C. of less than $40 \times 10^{-6}/°$ C.

6. A device, method or film according to claim 3 wherein the poly(ethylene naphthalate) has an intrinsic viscosity of 0.5–1.5.

7. A device, method or film according to claim 3 wherein said heat-stabilized film has a % of scattered visible light (haze) of <1.5%.

8. A method for the manufacture of an electronic or opt-electronic device containing a conjugated conductive polymer and a substrate comprising a heat-stabilised, heat-set oriented poly(ethylene naphthalate) film having a shrinkage at 30 mins at 230° C. of less than 1%, said process comprising the steps of:
   (i) forming a layer comprising poly(ethylene napthtalate);
   (ii) stretching the layer in at least one direction;
   (iii) heat-setting under dimensional restraint at a tension in the range of about 19 to about 75 kg/m of film width at a temperature above the glass transition temperature of the polyester but below the melting temperature thereof;
   (iv) heat-stabilising under tension of less than 5 kg/m of film width, and at a temperature above the glass transition temperature of the polyester but below the melting temperature thereof; and
   (v) providing the heat-stabilised, heat-set, oriented film as substrate in the device.

9. The method of claim 8 wherein said device is an opto-electronic device.

10. The method of claim 8 wherein said device is an electroluminescent display device.

11. The method of claim 8 wherein said device is an organic light-emitting display device.

12. The method of claim 8 wherein said device is a photovoltaic cell or semi-conductor device.

13. The method according to claim 8 wherein said substrate has a residual dimensional change $\Delta L_T$, measured at 25° C. before and after heating from 8° C. to 200° C. and then cooling to 8° C., of less than 0.75% of the original dimension.

14. The method according to claim 8 wherein said substrate has a coefficient of linear thermal expansion (CLTE) within the temperature range from −40° C. to +100° C. of less than $40 \times 10^{-6}/°$ C.

15. The method of claim 8 further comprising the step of coating the heat-stabilised, heat-set oriented film substrate with a barrier layer.

16. The method of claim 15 further comprising the step of providing an electrode by applying a conductive material onto at least part of the barrier layer.

17. The method of claim 16 further comprising the step of disposing the conductive conjugated polymer in contact with the electrode.

18. A method according to claim 8 wherein the heat-stabilisation step is conducted off-line.

19. A method according to claim 8, wherein the heat-stabilization is effected at a temperature in the range of 200 to 230° C.

20. A method according to claim 8, wherein the heat-setting is effected at a temperature in the range of 235 to 240° C.

21. A method according to claim 8 or 18 wherein the heat-stabilisation is effected at a tension in the range of 1.0 to 2.5 kg/m of film width.

22. A method according to claim 8, or 18 wherein the heat-setting is effected at a tension in the range of 45 to 50 kg/m of film width.

23. A device, method or film according to claim 8, 1, 2, 3, or 4 wherein the poly(ethylene naphthalate) is derived from 2,6-naphthalenedicarboxylic acid.

24. A device, method or film according to claim 8, 1, 2, 3, or 4 wherein said heat-stabilized film is biaxially oriented.

* * * * *